United States Patent
Nagayasu et al.

[11] Patent Number: 5,972,768
[45] Date of Patent: Oct. 26, 1999

[54] METHOD OF MANUFACTURING SEMICONDUCTOR DEVICE HAVING LOW CONTACT RESISTANCE

[75] Inventors: Yoshihiko Nagayasu; Tatsuhiko Fujihira; Kazutoshi Sugimura; Yoichi Ryokai, all of Nagano, Japan

[73] Assignee: Fuji Electric Co. Ltd., Japan

[21] Appl. No.: 08/803,193

[22] Filed: Feb. 19, 1997

[30] Foreign Application Priority Data

Feb. 19, 1996 [JP] Japan ...................................... 8-030275

[51] Int. Cl.$^6$ .................................................. H01L 21/331
[52] U.S. Cl. ........................... 438/370; 438/371; 438/372; 438/621
[58] Field of Search ...................... 438/306, 420, 438/232, 621, 370, 371, 372

[56] References Cited

U.S. PATENT DOCUMENTS

| | | | |
|---|---|---|---|
| 3,943,621 | 3/1976 | Hartman | 438/565 |
| 4,717,678 | 1/1988 | Goth | 438/372 |
| 5,374,571 | 12/1994 | Mukherjee et al. | 438/268 |

FOREIGN PATENT DOCUMENTS

| | | |
|---|---|---|
| 5-335559 | 12/1993 | Japan . |
| 06252173A | 9/1994 | Japan . |

*Primary Examiner*—Richard Booth
*Assistant Examiner*—John Murphy
*Attorney, Agent, or Firm*—Rossi & Associates

[57] ABSTRACT

In a method of manufacturing a semiconductor device, an insulating film is formed on a surface of a p-type semiconductor region, and then removed from a selected portion of the p-type semiconductor region. An n-type region having a high concentration of arsenic atoms is formed in a surface layer of the selected portion of the p-type semiconductor region from which the insulating film is removed. Subsequently, boron ions are implanted over an entire surface of the device in a concentration that is lower than that of the n-type region and higher than that of the p-type semiconductor region, to a smaller depth than that of the n-type region, and heat treatment is then effected to form a high-concentration boron diffused region in a surface layer of the p-type semiconductor region. An insulating film on the n-type region and an insulating film on the boron diffused region are selectively removed, and a metallic film is formed on an exposed surface of the n-type region and an exposed surface of the boron diffused region.

4 Claims, 8 Drawing Sheets

METHOD OF MANUFACTURING SEMICONDUCTOR DEVICE HAVING LOW CONTACT RESISTANCE

FIELD OF THE INVENTION

The present invention relates to a method of manufacturing a semiconductor device, such as a MOSFET.

BACKGROUND OF THE INVENTION

In a metal-oxide-semiconductor field-effect transistor (MOS FET), the on resistance increases with an increase in the contact resistance between a source electrode, and a surface of a source region and a surface of a p well region. The relationship between the contact resistance and the impurity concentration of silicon is disclosed in A.Y.C.Yu, Electron Tunneling and Contact Resistance of Metal-Silicon Contact Barriers, Solid State Electronics, 13, p279, 1970, and VLSI process data handbook p319 (Science Forum), for example.

FIGS. 16(a) and 16(b) show the dependence of the contact resistance of aluminum (Al) and silicon upon the impurity concentration, wherein FIG. 16(a) indicates the case where n-type silicon is used, and FIG. 16(b) indicates the case where p-type silicon is used. In FIG. 16(a), the contact resistance can be reduced to $10^{-6}$ Ω cm$^2$ or lower by controlling the impurity concentration (donor concentration) to be $10^{20}$ cm$^{-3}$ or higher. If the impurity concentration is reduced by one order of magnitude, i.e., to $10^{19}$ cm$^{-3}$, however, the contact resistance, which greatly depends on the impurity concentration, increases by six orders of magnitude ($10^6$ times) to 1 Ω cm$^2$. In FIG. 16(b), the contact resistance may be reduced to $10^{-6}$ Ω cm$^2$ or lower by controlling the impurity concentration (acceptor concentration) to be only about $5\times10^{18}$ Ω cm$^{-3}$. Thus, in order to control the contact resistance of a MOSFET to be $10^{-6}$ Ω cm$^2$ or lower, for example, the surface concentration of its n source region needs to be controlled to be $10^{20}$ cm$^{-3}$ or higher, and the surface concentration of its p well region needs to be controlled to be $5\times10^{18}$ cm or higher.

FIG. 17 shows a first known example of manufacturing method for reducing the contact resistance, wherein (a) through (f) are process steps to be taken in this order in this method. In the step (a), an n-type region 2a and a p-type region 3a are formed in a semiconductor region 60, and surfaces of these regions 2a, 3a, 60 are covered with an oxide film 4. In the step (b), the oxide film 4 is covered with a photoresist film (hereinafter referred to simply as "resist film) that is not shown in the figure, and selected portions of the oxide film 4 are removed by etching, using this resist film as a mask, so as to form contact holes 5. The resist film is then removed. In the step (c), a resist film 6 is formed over the entire surface of the structure obtained in the step (b), and a portion of the resist film 6 that is located on the n-type region 2a is removed so that the other portion of the film 6 that is not on the n-type region 2a remains on the structure. In the step (d), ionized n-type impurity atoms (indicated by arrows 7) are implanted using the resist film 5 as a mask exclusively used for forming an n-type impurity region 15a. In the step (e), the resist film 6 is removed and heat treatment is carried out, so that the high-concentration n-type impurity region 15a that provides an n-type contact region is formed in a surface layer of the n-type region 2a. In the step (f), metal wiring layers or conductive layers 9 are secured to the n-type contact region provided by the high-concentration n-type impurity region 15a, and a p-type contact region formed at the surface of the p-type region 3a.

FIG. 18 shows a second known example of manufacturing method for reducing the contact resistance, wherein (a) through (f) are process steps to be taken in this order. In this known method, the contact resistance is reduced by securing a metal wiring layer to both an n-type region and a p-type region. In the step (a) of FIG. 18, an oxide film 4 is formed on a semiconductor region 60, and an opening is provided in the oxide film 4. Ions of p-type impurity atoms are then implanted into the semiconductor region 60, using the oxide film 4 as a mask exclusively used for forming a p-type region 3b that provides a p-type contact region. In the step (b), an oxide film 4g is formed in the opening of the oxide film 4. In the step (c), an opening is provided in the oxide films 4, 4g, and an n-type region 2b that provides an n-type contact region is formed adjacent to the p-type region 3b, using these oxide films 4, 4g as an exclusive mask for forming the region 2b. In the step (d), an oxide film 4h is formed in the opening by thermal oxidation or CVD method. In the step (e), an opening is provided in the oxide film 4h, so as to form a contact hole 5. In the step (f), a metal wiring layer or conductive layer 9 is secured to the surface of the n-type region 2b that provides the n-type contact region, and to the surface of the p-type region 3b that provide the p-type contact region.

In either of the known examples of FIGS. 17 and 18, the ion implantation steps for forming the n-type contact region and the p-type contact region require respective photolithography steps using exclusive masks for forming these contact regions. This undesirably increases the manufacturing cost. In addition, errors in matching these exclusive masks, namely, positioning these masks relative to each other, in the photolithography steps may cause a deviation of the dimensions of the n-type contact region or p-type contact region from design values, or a deviation of the ratio of the sizes or areas of the n-type and p type contact regions from a design value, resulting in an increase in the contact resistance.

SUMMARY OF THE INVENTION

It is therefore an object of the present invention to provide a method of manufacturing a semiconductor device in which contact regions having low resistance can be formed due to their self alignment, without using exclusive masks for forming these regions.

To accomplish the above object, there is provided according to a first aspect of the present invention a method of manufacturing a semiconductor device, comprising the steps of: forming an insulating film on a surface of a p-type semiconductor region, and removing the insulating film from a selected portion of the p-type semiconductor region; forming an n-type region having a high concentration of arsenic atoms, in a surface layer of the selected portion of the p-type semiconductor region from which the insulating film is removed; ion-implanting boron atoms over an entire surface of the device in a concentration that is lower than that of the n-type region and higher than that of the p-type semiconductor region., to a smaller depth than that of the n-type region, and then effecting heat treatment so as to form a high-concentration boron diffused region in a surface layer of the p-type semiconductor region; selectively removing an insulating film on the n-type region and an insulating film on the boron diffused region; and forming a metallic film on an exposed surface of the n-type region and an exposed surface of the boron diffused region.

In the above-described manufacturing method in which the high-concentration boron diffused region is formed in the surface layer of the p well region so as to achieve low contact resistance, the n source region composed of arsenic atoms is formed in the surface layer of the p well region, using an insulating film as a mask, and boron ions are implanted over the entire surface to penetrate the insulating film, and then heat-treated, so as to form the boron diffused region. Thus, the present method eliminates the need to use an exclusive mask for forming the boron diffused region. The boron atoms in the n source region are fixed to the arsenic atoms, unable to diffuse, and thus remain within the n source region. Further, there is no need to match masks for forming the n source region and the boron diffused region, and therefore the sizes or areas of the contact regions of the p well region and n source region can be controlled to those just as designed.

According to a second aspect of the present invention, there is provided a method of manufacturing a semiconductor device, comprising the steps of forming a first insulating film having a first thickness on a surface of an n-type semiconductor region, and removing the first insulating film from a selected portion of the fl-type semiconductor region; forming a p-type region in a surface layer of the selected portion of the n-type semiconductor region from which the first insulating film is removed; forming a second insulating film having a second thickness that is smaller than the first thickness of the first insulating film, on the selected portion from which the first insulating film is removed, and removing the second insulating film from a selected portion of the p-type region; forming an n-type region comprising arsenic atoms in a surface layer of the selected portion of the p-type region from which the second insulating film is removed; ion-implanting boron atoms having a lower concentration than that of the n-type region, to a smaller depth than that of the n-type region, such that the boron atoms penetrate the second insulating film but do not penetrate the first insulating film, and then effecting heat treatment so as to form a high-concentration boron diffused region in a surface layer of the p-type region; selectively removing the second insulating film on the n-type region and the boron diffused region; and forming a metallic film on an exposed surface of the n-type region and an exposed surface of the boron diffused region.

In the method described just above, the p well region is formed in the n-type semiconductor region, using the first insulating film as a mask, the n source region composed of arsenic atoms is formed in the surface layer of the p well region, and then the surface concentration of the p well region is increased so as to obtain low contact resistance. In this method, the boron ions implanted over the entire surface do not penetrate the first insulating film with a large thickness on the n-type semiconductor region, but penetrate the second insulating film with a small thickness on the p well region so as to increase the concentration of the surface layer of the p well region thereby to reduce the contact resistance. This method provides the same effects as obtained in the method according to the first aspect of the invention. The boron atoms of the n source region are fixed to the arsenic atoms, unable to diffuse, and remain within the n source region. This method is useful in reducing the contact resistance in such a semiconductor device as a MOS FET.

According to a third aspect of the present invention, there is provided a method of manufacturing a semiconductor device, comprising the steps of: forming an insulating film on a surface of a p-type semiconductor region, and removing the insulating film from a selected portion of the p-type semiconductor region; forming a high-concentration n-type region in a surface layer of the selected portion of the p-type semiconductor region from which the insulating film is removed; ion-implanting boron atoms over an entire surface of the device in a concentration that is lower than that of the n-type region and higher than the p-type semiconductor region, to a smaller depth than that of the n-type region, and effecting heat treatment so as to form a high-concentration boron diffused region in a surface layer of the p-type semiconductor region; ion-implanting arsenic atoms into a surface layer of the n-type region so as not to penetrate the insulating film, and then effecting heat treatment so as to form a high-concentration arsenic diffused region in a surface layer of the n-type region; selectively removing an insulating film on the arsenic diffused region and the boron diffused region, and forming a metallic film on an exposed surface of the arsenic diffused region and an exposed surface of the boron diffused region.

In the above-described manufacturing method in which the surface concentration of each of the p well region and n source region is increased so as to reduce the contact resistance, both the boron ions and the arsenic ions can be implanted over the entire surface of the device, by controlling the accelerating voltage of the ion implantation for implanting the boron atoms so that the boron ions to be implanted penetrate the insulating film on the p well region, and controlling the accelerating voltage of the ion implantation for implanting the arsenic atoms so that the arsenic ions do not penetrate the insulating film on the p well region. This eliminates the need to use exclusive masks for forming the boron diffused region and arsenic diffused region, thus providing the same effects as obtained in the method according to the first aspect of the invention. Since the arsenic ions are implanted through a thin insulating film formed by heat treatment or the like, the semiconductor surface in which the ions are implanted are less likely to be roughened, assuring an improved device characteristics.

According to the third aspect of the present invention, boron atoms or arsenic atoms may or may not penetrate an oxide film used for forming the p well region or n source region, depending upon the thickness of the oxide film and the condition(s) under which the ion implantation is effected. Thus, utilizing a combination of such oxide films having different thicknesses as a mask, the boron diffused region and arsenic diffused region may be formed by implanting the boron and arsenic ions over the entire surface, without using exclusive masks for forming these diffused regions. This means that the steps of forming a resist film, patterning, and removing the resist film need not be carried out prior to each ion implantation step. Since an exclusive mask is not necessary for forming the arsenic diffused region, the surface concentration of the n source region as the arsenic diffused region can be increased due to the self alignment, without suffering from errors in matching masks. Consequently, the contact resistance can be reduced by securing the same metal to the n source region having the thus increased surface concentration and the p well region.

Since the boron atoms implanted in the n source region formed of arsenic atoms are fixed to the arsenic atoms, this implantation does not increase the concentration of the p-type semiconductor region right below the n source region even though the diffusion coefficient of the boron atoms is larger than that of the arsenic atoms. Hence, the boron atoms thus implanted have no influence on the threshold voltage (Vth) of a MOS FET having a trench gate structure.

BRIEF DESCRIPTION OF THE DRAWINGS

This invention will be described in greater detail with reference to certain preferred embodiments thereof and the accompanying drawings, wherein.

DETAILED DESCRIPTION OF THE PREFERRED EMBODIMENTS

FIG. 1 through FIG. 6 show process steps to be taken in this order in a manufacturing method of one embodiment of the present invention. These figures particularly describe the steps of forming contact regions in the process of forming a MOSFET in a silicon substrate.

Figure 1:
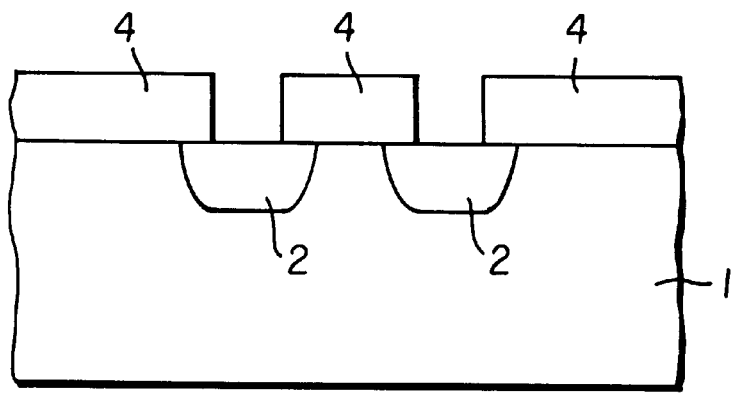
FIG. 1 is a view showing a process step of a manufacturing method according to the first embodiment of the present invention.

In FIG. 1, an oxide film 4 having a thickness of 300 nm is formed on a p semiconductor region that provides a p well region 1, and a resist film (not shown) is formed on this oxide film 4 and then patterned, so that a selected portion of the oxide film 4 is etched to provide an opening. The resist film is then removed. Subsequently, ionized arsenic atoms are implanted at an accelerating voltage of 30 kV–200 kV in a dose amount of $5 \times 10^{15}$ cm$^{-2}$, for example, and heat treatment is conducted for 30 min. at 1100° C., so as to form an n source region 2 that is an arsenic diffused region having a diffusion depth of 0.8 μm.

Figure 2:
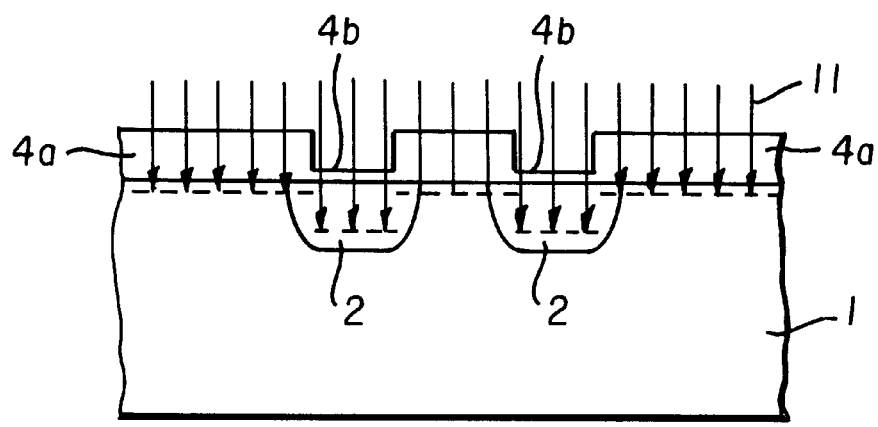
FIG. 2 is a view showing a step following the step of FIG. 1 in the method of the first embodiment of this invention.

After the steps of forming oxide films so as to form regions that are not illustrated in the figures, and removing these oxide films, following the step of FIG. 1, an oxide film 4$b$ is formed in the opening formed in the step of FIG. 1 and an oxide film 4$a$ is formed on a region other than the opening as shown in FIG. 2, such that a difference in the thickness between the oxide films 4$a$ and 4$b$ is in the range of 100 nm to 200 nm. In this condition, ionized boron atoms (indicated by arrows 11 in FIG. 2) are implanted over the entire surface that bears these oxide films 4$a$, 4$b$. This ion implantation is effected at an accelerating voltage of 100 kV in a dose amount of $5 \times 10^{14}$ cm$^{-2}$. Since the range of the ionized boron atoms 11 that are being implanted under these conditions is about 300 nm, the boron atoms readily penetrate or pass through the oxide film 4$a$ on the region other than the opening, and are introduced into the p well region 1. Although the boron atoms are also introduced into the n source region 2 at the same time, the total amount of the boron atoms thus implanted is smaller by one order of magnitude than that of the arsenic atoms in the n source region 2, and the mobility of electrons is one third of that of holes, whereby the resistance value of the n source region 2 increases by only about 1/30 as compared with the value measured before the boron atoms are introduced, and is thus hardly influenced by the boron atoms implanted. Further, the boron ions that are positive ions are attracted to the arsenic ions that are negative ions, and therefore cannot move during the heat treatment and remain within the n source region 2. Accordingly, the n source region 2 is not reversed into p type, nor increase the concentration of the p well region 1 right below the n source region 2.

Figure 3:
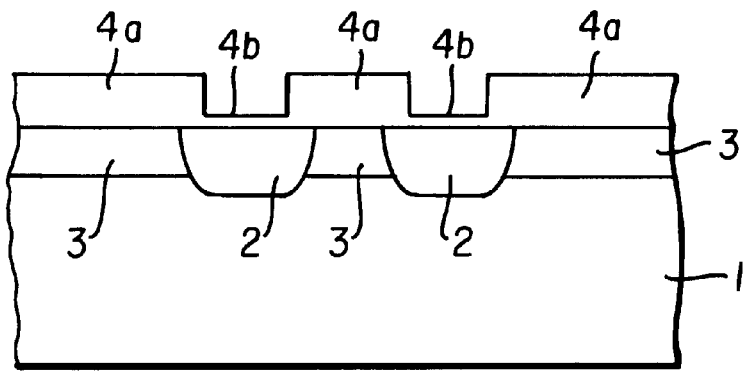
FIG. 3 is a view showing a step following the step of FIG. 2 in the method of the first embodiment of this invention.

After implanting the boron ions in the step of FIG. 2, the heat treatment is conducted in the step of FIG. 3 to form a high-concentration boron diffused region 3 in a surface layer of the p well region 1 so as to reduce the contact resistance of a p type contact region.

There will be next explained a method of reducing the contact resistance of the n source region 2.

Figure 4:
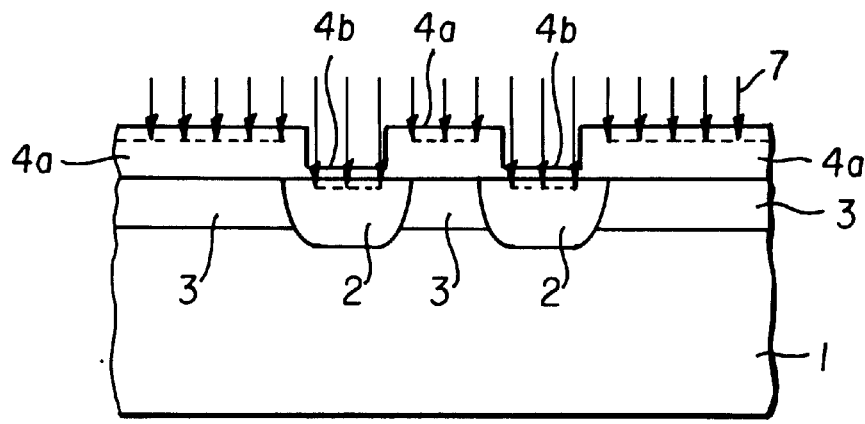
FIG. 4 is a view showing a step following the step of FIG. 3 in the method of the first embodiment of this invention.

In the step of FIG. 4, ionized arsenic atoms (as indicated by arrows 7) are implanted over the entire surface of the structure obtained in the step of FIG. 3. The ion implantation is effected at an accelerating voltage of 120 kV in a dose amount of $5 \times 10^{15}$ cm$^{-2}$. The standard range $R_p$ of the arsenic ions 7 that are implanted at this accelerating voltage as measured within the oxide films is 56 nm, and a deviation of this range $\Delta R_p$ is 18 nm. If the thickness of the oxide film 4$b$ on the n source region 2 becomes 50 nm, mid the thickness of the oxide film 4$a$ on the boron diffused region 3 becomes 200 nm in the step of FIG. 3, after repeatedly forming oxide films by heat treatment, patterning, and etching the oxide films to form regions other than the regions formed in the steps of FIGS. 1–3, the arsenic atoms are introduced into a surface layer of the n source region 2 through the relatively thin oxide film 4$b$, but do not reach the boron diffused region 3. If the thickness of the oxide films is changed, the accelerating voltage may be set to a level that is best suited to the thickness of the oxide films. Since the ion implantation of the arsenic atoms for increasing the surface concentration of the n source region 2 does not require the use of an exclusive mask, but uses as a mask the oxide film 4 for forming the n source region 2 (though the initial thickness of this film 4 is changed to those of the films 4a, 4b after the above-described steps), a high-concentration arsenic diffused region 15 can be formed in the surface layer of the n source region 2 due to its self alignment, by effecting heat treatment after the ion implantation step.

Figure 5:
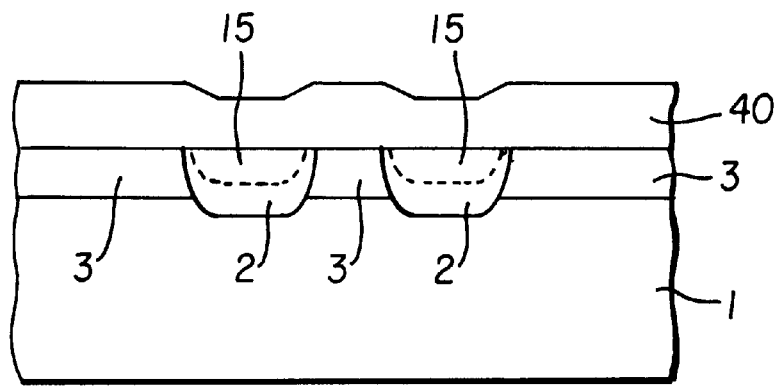
FIG. 5 is a view showing a step following the step of FIG. 4 in the method of the first embodiment of this invention.

Following the step of FIG. 4 in which the high-concentration arsenic diffused region 15 that provides a n-type contact region is formed in the surface layer of the n source region by heat treatment, an oxide film is deposited by a vacuum CVD method, to increase the thickness of the oxide films 4a, 4b thereby to provide an oxide film 40, as shown in FIG. 5.

Figure 6:
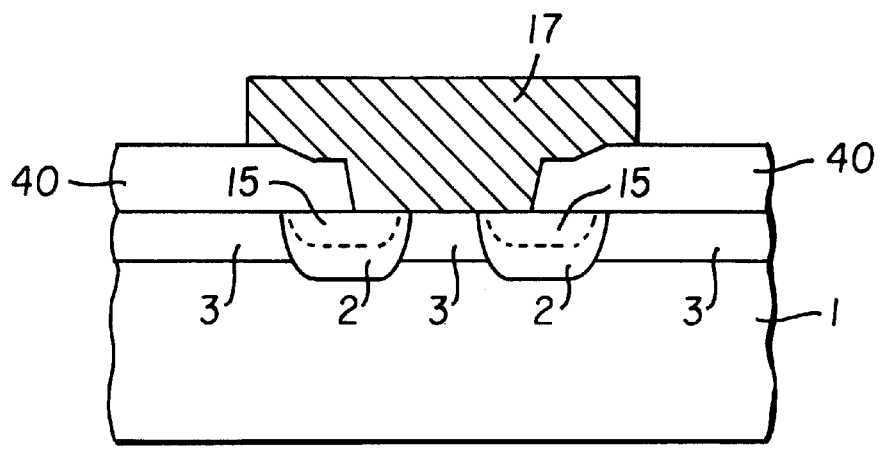
FIG. 6 is a view showing a step following the step of FIG. 5 in the method of the first embodiment of this invention.

In the step of FIG. 6 following the step of FIG. 5, an opening is formed through the oxide film 40, and a metal wiring layer 17 is secured to the n-type contact region provided by the arsenic diffused region 15, and a p-type contact region provided by the boron diffused region 3. Since these contact regions have high concentrations of impurities, the contact resistance is reduced to a sufficiently low level.

FIG. 7 through FIG. 14 show process steps to be taken in this order in a manufacturing method of the second embodiment of the present invention. In this embodiment, the invention is applied to a MOSFET having a trench structure, and these figures particularly show the steps of forming a p well region, n source region, trench, contact regions and others in a n-type semiconductor substrate.

Figure 7:
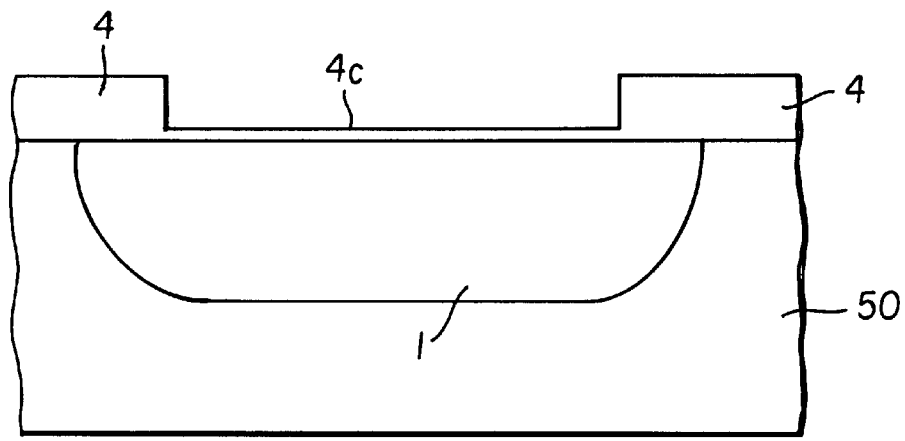
FIG. 7 is a view showing a process step of a manufacturing method according to the second embodiment of the present invention.

In FIG. 7, an oxide film 4 having a thickness of 800 nm is formed on a surface of an n-type semiconductor substrate 50 (that will provide an n drift region after other regions are formed), and a resist film (not shown) is formed on the oxide film 4 and then patterned, so that a selected portion of the oxide film 4 is etched to provide an opening. The resist film is then removed. Subsequently, ionized boron atoms are implanted at an accelerating voltage of 50 kV in a dose amount of $5 \times 10^{13}$ cm$^{-2}$, for example, and heat treatment is conducted for 3 hours at 1150° C., so as to form a p well region 1 in which the boron atoms are diffused to a depth of about 2.5 $\mu$m. As a result of this heat treatment, an extremely thin oxide film 4c is formed in the opening of the oxide film 4.

Figure 8:
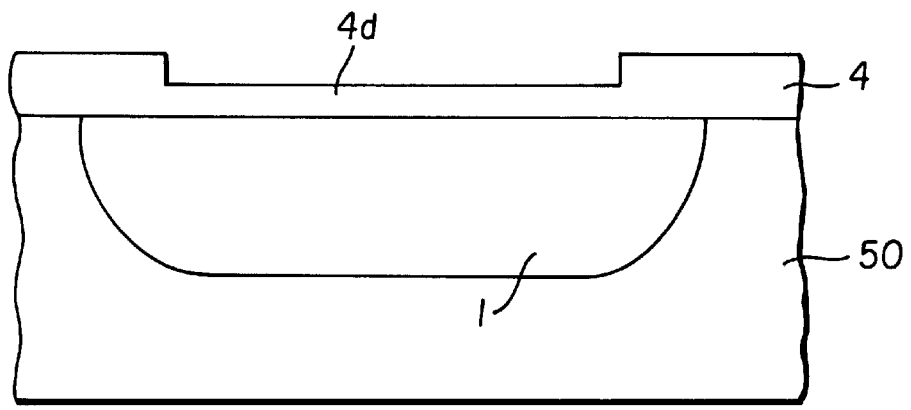
FIG. 8 is a view showing a step following the step of FIG. 7 in the method of the second embodiment of this invention.

Following the above step of FIG. 7, an oxide film 4d having a thickness of 300 nm is deposited on the oxide film 4c of FIG. 7, as shown in FIG. 8.

Figure 9:
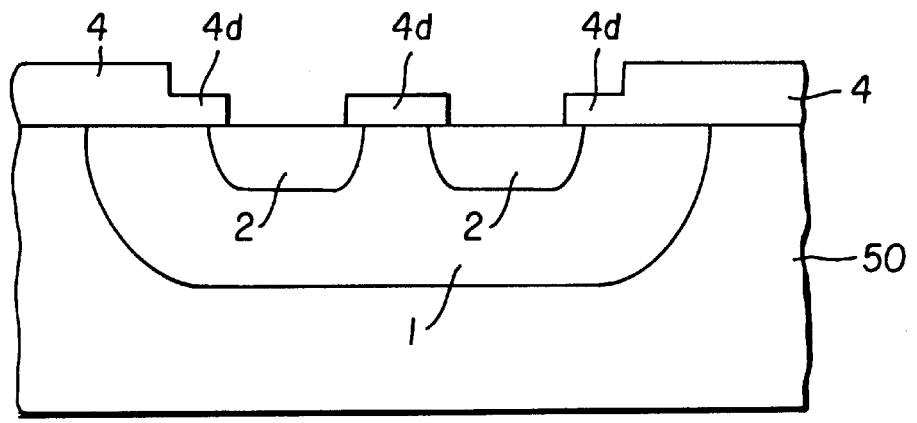
FIG. 9 is a view showing a step following the step of FIG. 8 in the method of the second embodiment of this invention.

In the step of FIG. 9 following the step of FIG. 8, a resist film is formed on the oxide film, and then patterned so that a selected portion of the oxide film on the p well region 1 is etched and removed to thus provide an opening. Thereafter, ionized arsenic atoms are implanted at an accelerating voltage of 50 kV in a dose amount of $5 \times 10^{15}$ cm$^{-2}$, for example, and heat treatment is then effected for 30 min. at 1100° C. so as to form an n source region 2 in which the arsenic atoms are diffused to a depth of 0.8 $\mu$m.

Figure 10:
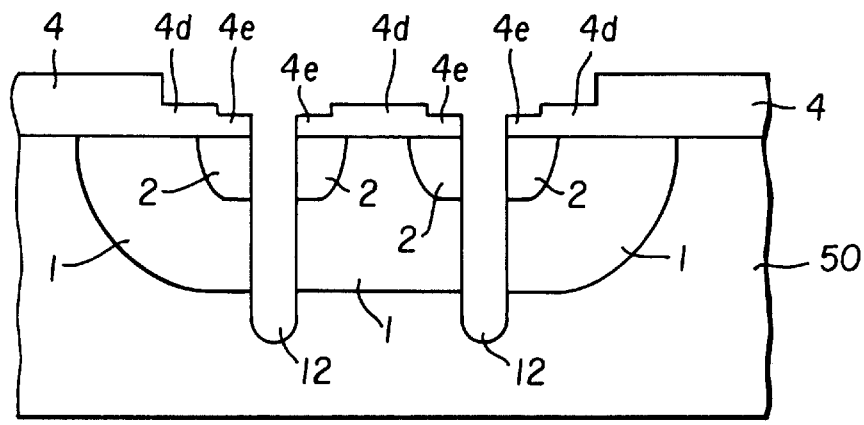
FIG. 10 is a view showing a step following the step of FIG. 9 in the method of the second embodiment of this invention.

In the step of FIG. 10 following the step of FIG. 9, the thickness of the oxide film is increased by a vacuum CVD method, and the oxide film thus deposited is patterned again and selectively etched to provide an opening where a trench 12 is formed through n source region 2 and p well region 1 that are aligned with the opening, so as to reach the n-type semiconductor substrate 50 (n drift region).

Figure 11:
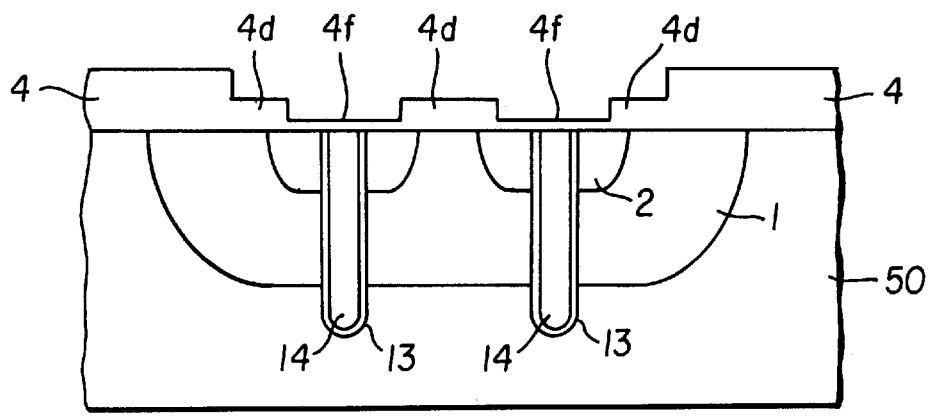
FIG. 11 is a view showing a step following the step of FIG. 10 in the method of the second embodiment of this invention.

In the step of FIG. 11 following the step of FIG. 10, a gate oxide film 13 is formed, and the trench 14 that is covered with the gate oxide film 13 is filled with polysilicon to thus provide a gate electrode 14. Thereafter, the oxide film is subjected to timed etching (i.e., etched to a predetermined depth), so that the thickness of the oxide film 4f on the n source region 2 is controlled to 50 nm, and the thickness of the p well region 1 is controlled to 200 nm. At this time, the thickness of the oxide film 4 on the n-type semiconductor substrate 50 and a part of the p well region 1 is controlled to about 700 nm.

Figure 12:
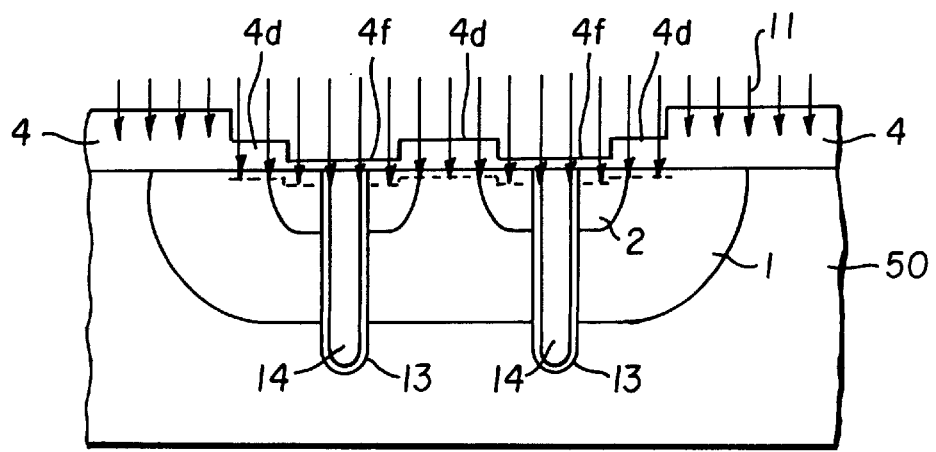
FIG. 12 is a view showing a step following the step of FIG. 11 in the method of the second embodiment of this invention.

In the step of FIG. 12, ionized boron atoms (as indicated by arrows 11) are implanted over the entire surface of the structure obtained in the step of FIG. 11 at an accelerating voltage of 100 kV in a dose amount of $5 \times 10^{14}$ cm$^{-2}$, for example. The standard range $R_p$ of the boron ions 11 that are implanted under these conditions is about 300 nm, and a deviation of this range $\Delta R_p$ is about 70 nm. Thus, the boron atoms remain in the oxide film 4, but penetrate the oxide films 4d, 4f, so as to increase the concentration of surface layers of the p well region 1 right below the oxide films 4d, thereby to form boron diffused regions 3 that provide p-type contact regions. This step may or may not be followed by heat treatment.

Figure 13:
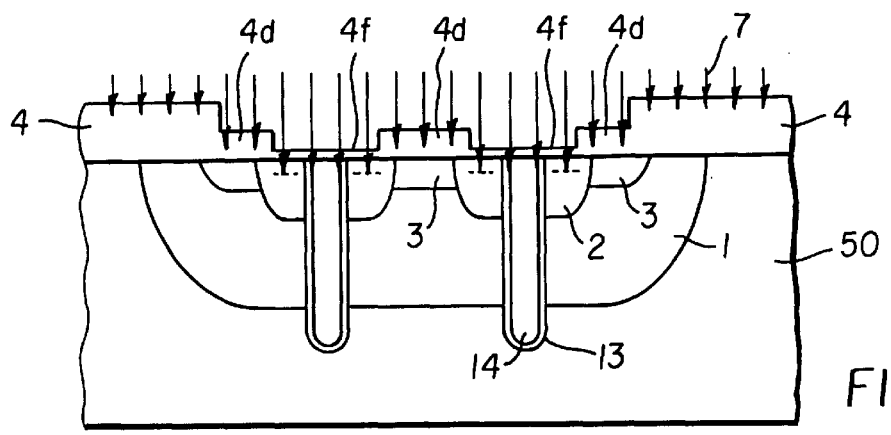
FIG. 13 is a view showing a step following the step of FIG. 12 in the method of the second embodiment of this invention.

In the step of FIG. 13. ionized arsenic atoms (as indicated by arrows 7) are implanted over the entire surface of the structure obtained in the step of FIG. 12 at an accelerating voltage of 120 kV in a dose amount of $5 \times 10^{15}$ cm$^{-2}$, for example. Since the standard range $R_p$ of the arsenic atoms 7 that are ion-implanted under these conditions is 56 nm, and a deviation of this range $\Delta R_p$ is 18 nm, as described above, the arsenic atoms penetrate the oxide film 4f, but do not penetrate the oxide films 4d, as in the first embodiment. Thus, an exclusive mask is not required for ion-implanting the arsenic atoms, and arsenic diffused regions 15 that provide n-type contact regions can be formed in the surface layer of the n source region 2 due to their self alignment.

Figure 14:
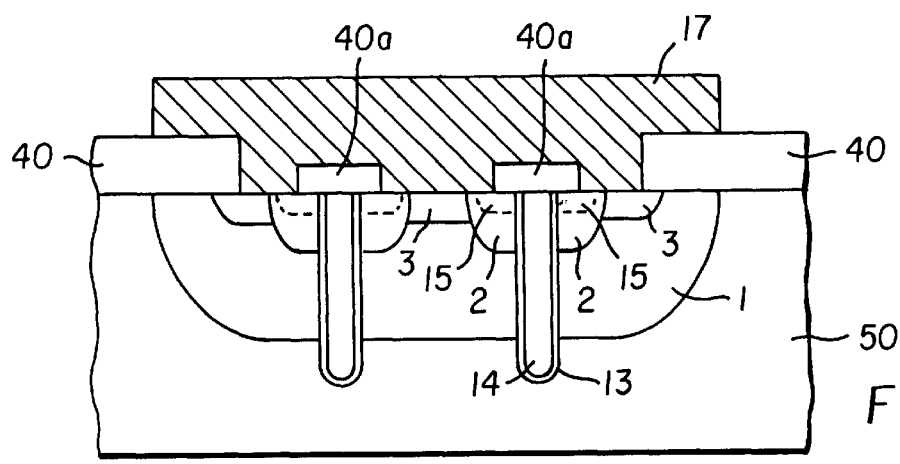
FIG. 14 is a view showing a step following the step of FIG. 13 in the method of the second embodiment of this invention.

In the step of FIG. 14 following the step of FIG. 13, additional oxide films are deposited on the oxide films 4, 4d, 4f by a CVD method, so as to increase the thickness of these oxide films. The obtained oxide films 40, 40a are then formed with openings through which are exposed the p-type contact regions provided by boron diffused regions 3, and the n-type contact regions provided by the arsenic diffused regions 15. A metal wiring layer 17 is then secured to these contact regions. With both of these contact regions having high concentrations of impurities, the contact resistance can be reduced to a sufficiently low level.

There will be next explained the behavior of boron atoms when they are ion-implanted and heat-treated in the n source region in which the arsenic atoms have been ion-implanted and heat-treated.

Figure 15:
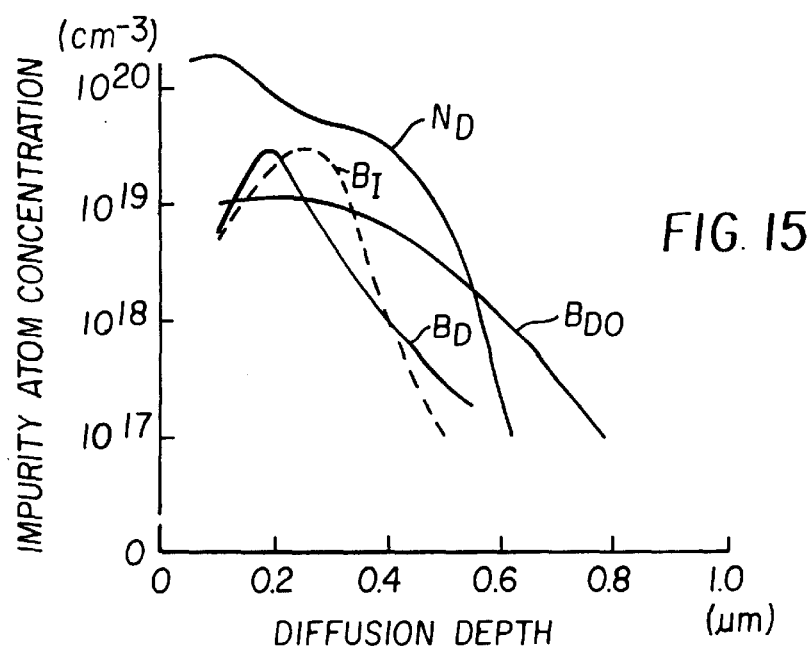
FIG. 15 is a graph showing the relationship between the diffusion depth and the concentration of impurities when boron atoms are diffused into a region in which arsenic atoms are diffused.
Figure 16B:
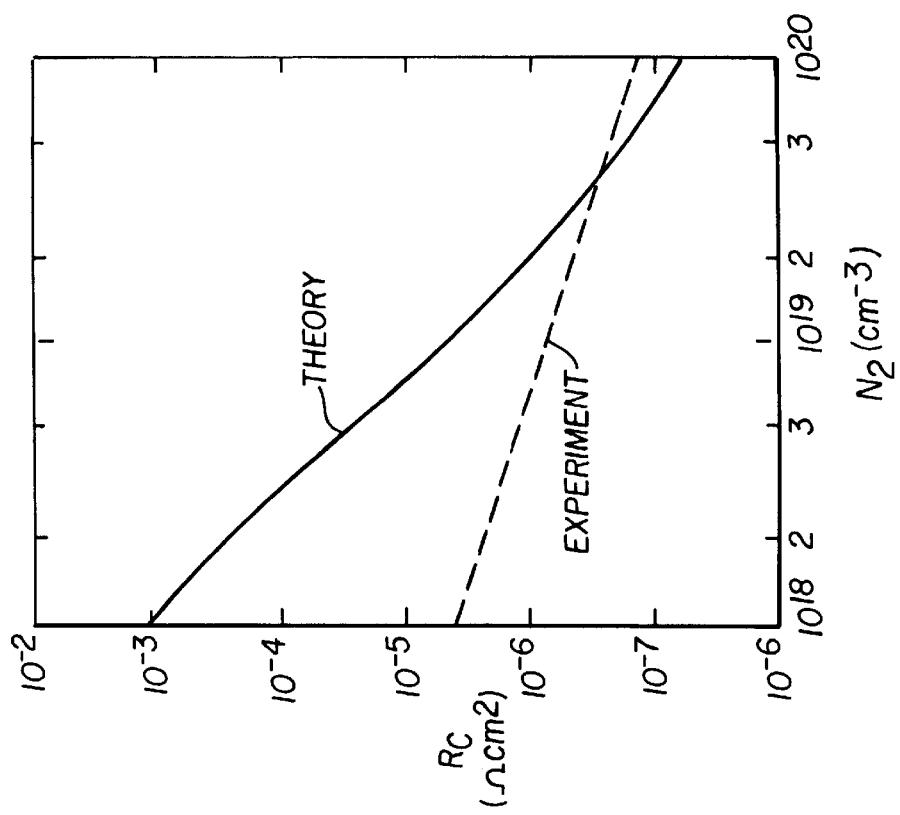
FIG. 16($a$) and FIG. 16($b$) are graphs showing the dependence of the contact resistance of aluminum (Al) and silicon on the impurity concentration.
Figure 16A:
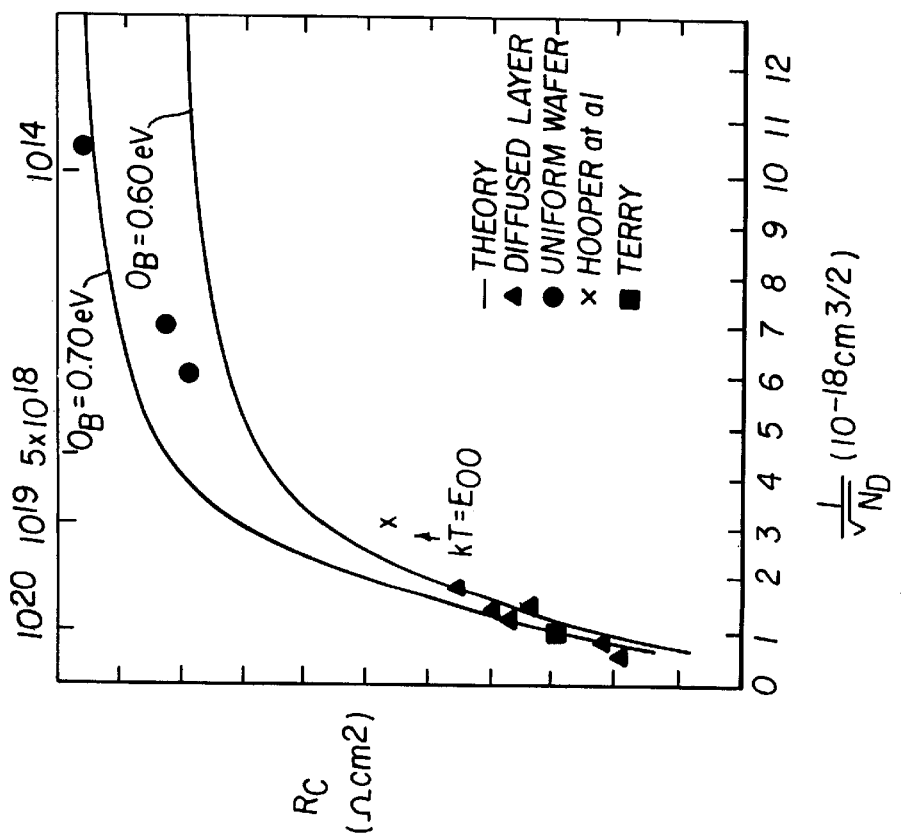
Figure 17A:
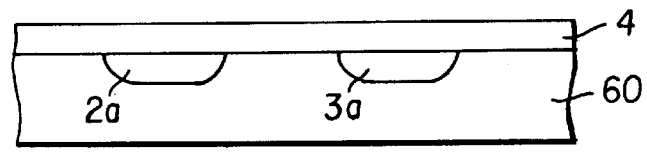
FIG. 17 is a view showing a first known example of manufacturing method for reducing the contact resistance, wherein (a) through (f) are process steps to be taken in this order.
Figure 17B:
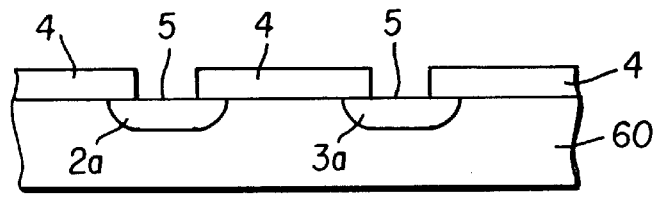
Figure 17C:
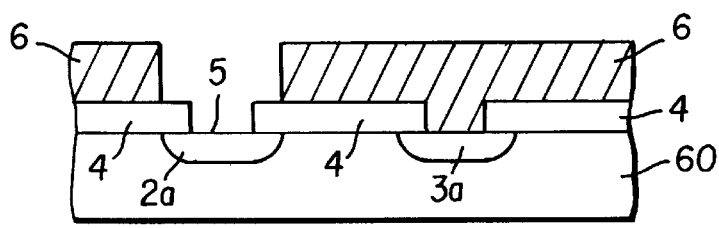
Figure 17D:
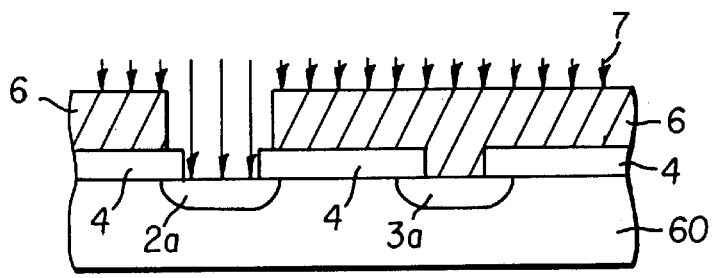
Figure 17E:
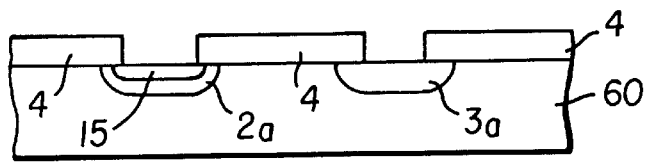
Figure 17F:
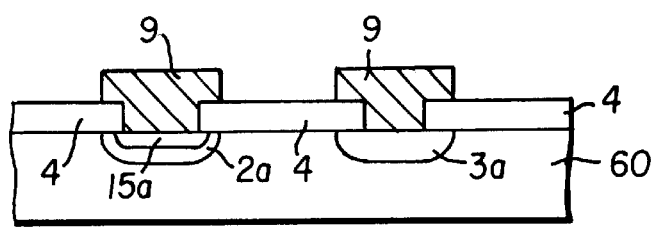
Figure 18A:
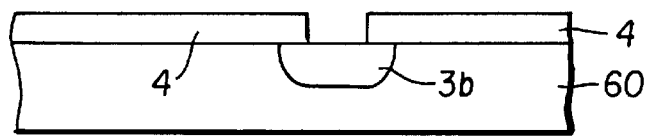
FIG. 18 is a view showing a second known example of manufacturing method for reducing the contact resistance, wherein (a) through (f) are process steps to be taken in this order.
Figure 18B:
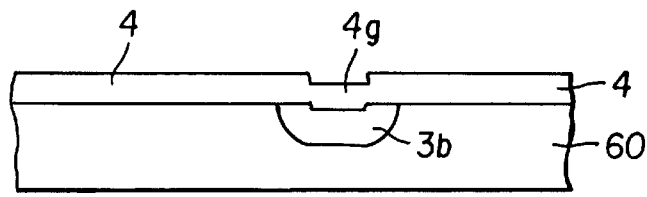
Figure 18C:
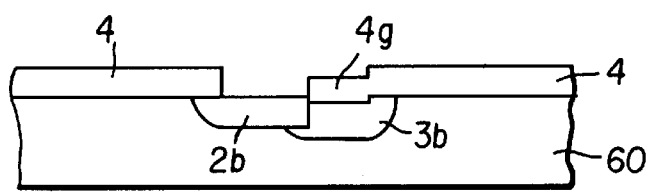
Figure 18D:
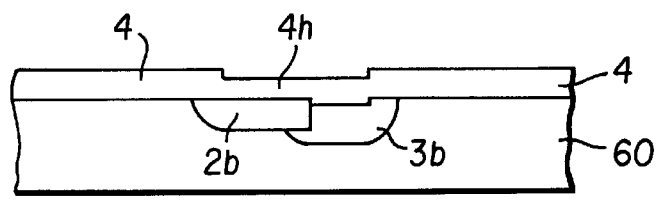
Figure 18E:
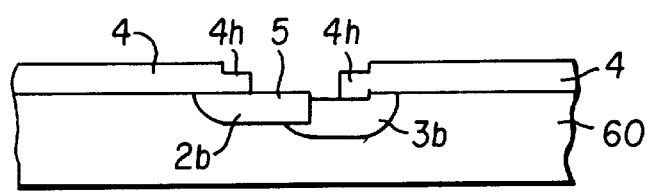
Figure 18F:
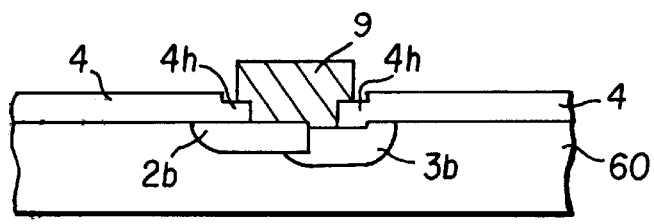

FIG. 15 is a graph showing the relationship between the diffusion depth and the concentration of impurities when the boron atoms are diffused into the region in which the arsenic atoms have been diffused. In this graph, Bi (indicated by a dot line) represents the concentration distribution of boron atoms that have been ion-implanted but not yet heat-treated, and $B_{DO}$ represents the concentration distribution of boron atoms that are ion-implanted into a region in which no arsenic atoms are diffused, and heat-treated. $N_D$ represents the concentration distribution of arsenic atoms in the diffused region of the arsenic atoms, and $B_O$ represents the concentration distribution of boron atoms that are ion-implanted in this diffused region of the arsenic atoms and heat-treated. It will be understood from FIG. 15 that when the boron atoms are ion-implanted and heat-treated in the region having no diffused region of the arsenic atoms, the diffusion coefficient of the boron atoms is larger than that of the arsenic atoms, and the diffusion depth exceeds 0.6 $\mu$m that is the diffusion depth of the arsenic atoms, and reaches 0.8 $\mu$m. This means that the diffusion depth of the boron atoms exceeds the depth of the n source region formed of arsenic atoms, and reaches the p well region right below the source region to increase the concentration of the p well region. Namely, in an n channel MOSFET having a trench structure, the concentration of the p well region that forms a channel is considerably increased, which is supposed to induce an increased threshold voltage and a reduced drain current. As is understood from the graph of FIG. 15 as a result of experiments, however, the ionized boron atoms, which are implanted and heat-treated in the presence of a high concentration of ionized arsenic atoms, are diffused only to a depth of 0.6 $\mu$m or smaller, as shown in the concentration distribution $B_D$. As a result, the concentration of the p well region right below the n source region is not increased, thus causing no increase in the threshold voltage and no reduction in the drain current. Thus, the diffusion of the boron atoms is restricted because the ionized boron atoms are attracted to electric fields produced by the ionized arsenic atoms.

While the MOSFET is illustrated in the above-described embodiment, the manufacturing method of the present invention is also applicable to an IGBT or a device having a MOS gate structure.

According to the present invention, the ion implantation for forming the p type and n type contact regions does not require the use of exclusive masks for forming these regions, thus simplifying or shortening the manufacturing process and reducing the manufacturing cost. Without using such exclusive masks, the p type and n type contact regions having high impurity concentrations can be formed adjacent to each other due to their self alignment, so as to provide sufficiently reduced contact resistance when a source electrode of a MOSFET is secured to the n source region and p well region, for example. With the contact regions thus formed due to their self alignment, errors in matching the masks need not be considered, and therefore the areas of the contact regions can be reduced compared to those of the conventional device. This eventually reduces the overall area of the resulting semiconductor chip and lowers the cost of the chip.

What is claimed is:

1. A method of manufacturing a semiconductor device, comprising the steps of:

forming a first insulating film on a surface of a p-type semiconductor region;

removing said first insulating film from a selected portion of said p-type semiconductor region;

forming an n-type region having a high concentration of arsenic atoms in a surface layer of said selected portion of said p-type semiconductor region from which said first insulating film is removed;

forming a second insulating film, having a second thickness that is smaller than said first thickness of said first insulating film, on said selected portion from which said first insulating film is removed;

ion-implanting boron atoms over an entire surface of the device, in a concentration that is lower than that of said n-type region and higher than that of said p-type semiconductor region, to a smaller depth than that of said n-type region, such that said boron atoms penetrate a remaining portion of said first insulating film and said second insulating film;

effecting heat treatment so as to form a boron diffused region in a surface layer of said p-type semiconductor region;

exposing a surface of said n-type region and a surface of said boron diffused region; and forming a metallic film on said exposed surface of said n-type region and said exposed surface of said boron diffused region.

2. A method of manufacturing a semiconductor device, comprising the steps of:

forming a first insulating film having a first thickness on a surface of an n-type semiconductor region;

removing said first insulating film from a selected portion of said n-type semiconductor region;

forming a p-type region in a surface layer of said selected portion of said n-type semiconductor region from which said first insulating film is removed;

forming a second insulating film, having a second thickness that is smaller than said first thickness of said first insulating film, on said selected portion from which said first insulating film is removed;

removing said second insulating film from a selected portion of said p-type region;

forming an n-type region comprising arsenic atoms in a surface layer of said selected portion of said p-type region from which said second insulating film is removed;

ion-implanting boron atoms having a lower concentration than that of said n-type region, to a smaller depth than that of the n-type region, such that said boron atoms penetrate a remaining portion of said second insulating film but do not penetrate a remaining portion of said first insulating film;

effecting heat treatment so as to form a boron diffused region in a surface layer of said p-type region;

exposing a surface of said n-type region and a surface of said boron diffused region; and forming a metallic film on said exposed surface of said n-type region and said exposed surface of said boron diffused region.

3. A method of manufacturing a semiconductor device, comprising the steps of:

forming a first insulating film on a surface of a p-type semiconductor region;

removing said first insulating film from a selected portion of said p-type semiconductor region;

forming a high-concentration n-type region in a surface layer of said selected portion of said p-type semiconductor region from which said insulating film is removed;

forming a second insulating film, having a second thickness that is smaller than said first thickness of said first insulating film, on said selected portion from which said first insulating film is removed;

ion-implanting boron atoms over an entire surface of the device, in a concentration that is lower than that of said n-type region and higher than said p-type semiconductor region, to a smaller depth than that of said n-type region, such that said boron atoms penetrate a remaining portion of said first insulation film and said second insulation film;

effecting heat treatment so as to form a boron diffused region in a surface layer of said p-type semiconductor region;

ion-implanting arsenic atoms into a surface layer of said n-type region, such that said arsenic atoms penetrate said second insulation film;

effecting heat treatment so as to form a high-concentration arsenic diffused region in a surface layer of said n-type region;

exposing a surface of said n-type region and a surface of said boron diffused region; and forming a metallic film on said exposed surface of said arsenic diffused region and said exposed surface of said boron diffused region.

4. A method of manufacturing a semiconductor device, comprising the steps of:

forming a first insulating film having a first thickness on a surface of an n-type semiconductor region;

removing said first insulating film from a selected portion of said n-type semiconductor region;

forming a p-type region in a surface layer of said selected portion of said n-type semiconductor region from which said first insulating film is removed;

forming a second insulating film, having a second thickness that is smaller than said first thickness of said first insulating film, on said selected portion from which said first insulating film is removed;

removing said second insulating film from a selected portion of said p-type region;

forming an n-type region comprising arsenic atoms in a surface layer of said selected portion of said p-type region from which said second insulating film is removed;

increasing the thickness of a remaining portion of said first insulating film and a remaining portion of said second insulating film by depositing additional oxide on said remaining portion of the first insulating film and said remaining portion of the second insulating film, wherein the additional oxide forms an oxide layer on said selected portions of said p-type region from which said second insulating film was previously removed;

ion-implanting boron atoms having a lower concentration than that of said n-type region, to a smaller depth than that of the n-type region, such that said boron atoms penetrate said remaining portion of said second insulating film and said oxide layer, but do not penetrate said remaining portion of the first insulating film;

effecting heat treatment so as to form a boron diffused region in a surface layer of said p-type region;

ion-implanting arsenic atoms into a surface layer of said n-type region, such that said arsenic atoms penetrate said oxide layer but do not penetrate the remaining portion of said second insulation film and said remaining portion of said first insulation film;

exposing a surface of said n-type region and a surface of said boron diffused region; and forming a metallic film on said exposed surface of said n-type region and said exposed surface of said boron diffused region.

* * * * *